(12) United States Patent
Pool

(10) Patent No.: US 9,514,939 B2
(45) Date of Patent: Dec. 6, 2016

(54) DUAL COATING AND LIFT-OFF METHOD FOR PROTECTING PATTERNED DIELECTRIC-METAL COATINGS

(71) Applicant: PIXELTEQ, INC., Largo, FL (US)

(72) Inventor: Jeffrey Pool, Largo, FL (US)

(73) Assignee: PIXELTEQ, INC., Largo, FL (US)

( * ) Notice: Subject to any disclaimer, the term of this patent is extended or adjusted under 35 U.S.C. 154(b) by 0 days.

(21) Appl. No.: 15/097,342

(22) Filed: Apr. 13, 2016

(65) Prior Publication Data

US 2016/0307750 A1 Oct. 20, 2016

Related U.S. Application Data

(60) Provisional application No. 62/147,776, filed on Apr. 15, 2015.

(51) Int. Cl.
| | |
|---|---|
| *H01L 21/44* | (2006.01) |
| *H01L 21/027* | (2006.01) |
| *H01L 21/768* | (2006.01) |
| *H01L 21/285* | (2006.01) |

(52) U.S. Cl.
CPC ....... *H01L 21/0272* (2013.01); *H01L 21/2855* (2013.01); *H01L 21/76892* (2013.01)

(58) Field of Classification Search
CPC .......... H01L 21/0272; H01L 21/76892; H01L 21/2855
USPC ........................................................ 438/670
See application file for complete search history.

(56) References Cited

U.S. PATENT DOCUMENTS

| | | | |
|---|---|---|---|
| 7,648,808 B2 * | 1/2010 | Buchsbaum | G02B 1/11 430/7 |
| 2005/0136648 A1 * | 6/2005 | Sharma | H01L 43/12 438/637 |
| 2013/0249032 A1 * | 9/2013 | Lee | H01L 31/103 257/432 |
| 2014/0370650 A1 * | 12/2014 | Moslehi | H01L 31/18 438/98 |
| 2015/0126029 A1 * | 5/2015 | Kimura | H05K 3/0076 438/670 |

* cited by examiner

*Primary Examiner* — David S Blum
(74) *Attorney, Agent, or Firm* — Dennis L. Cook, Esq.

(57) ABSTRACT

A dual coating and lift-off method for protecting patterned dielectric-metal coatings using a 2-layer lithography process that is exposed and developed to create an undercut and then, after the wafer is coated with a metal/dielectric filter ending with an incomplete final layer, the top lithography layer is lifted off exposing metal layer edges and leaving the bottom lithography layer intact on the wafer such that the final filter layer(s) can be deposited to complete the coating and passivate the exposed metal layer edges is disclosed.

1 Claim, 1 Drawing Sheet

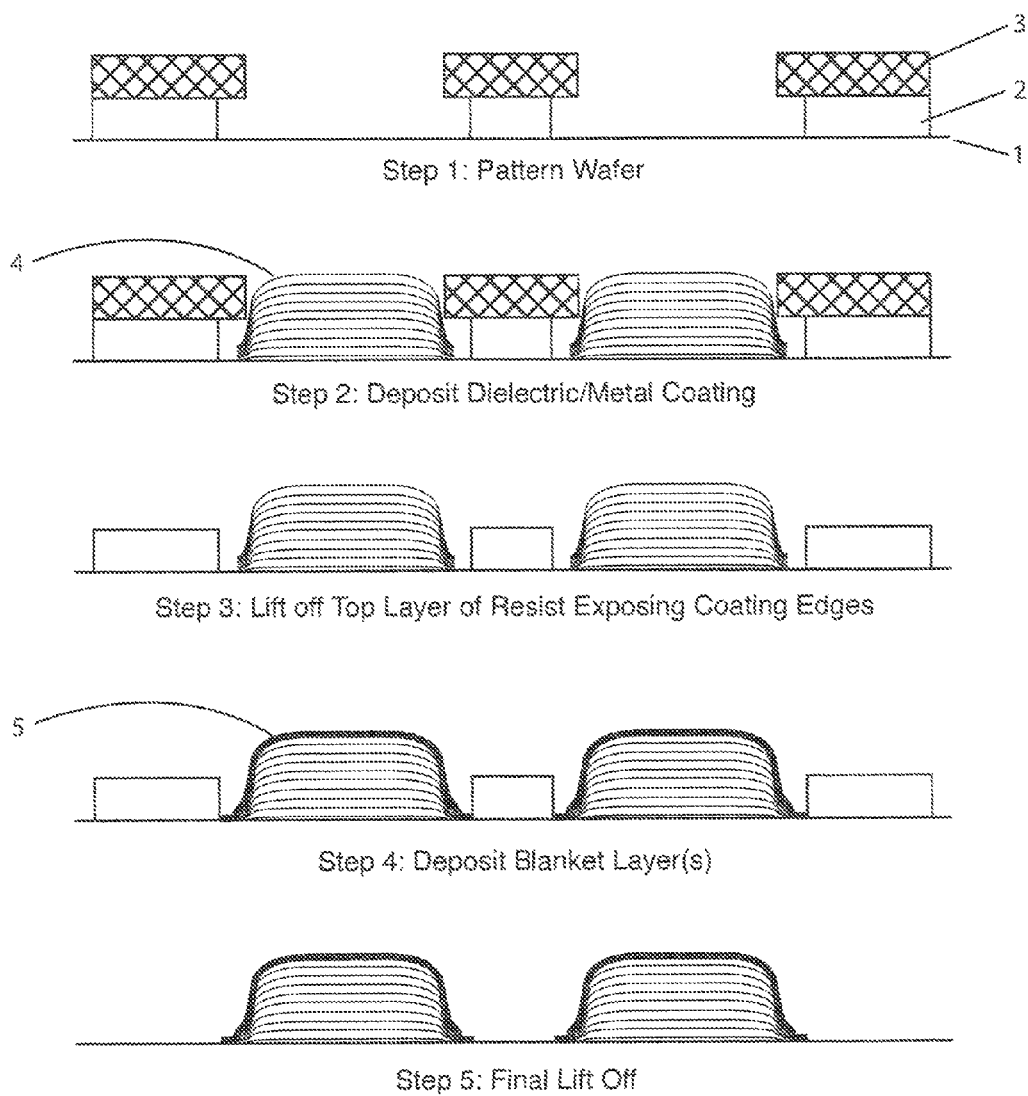

DUAL COATING AND LIFT-OFF METHOD FOR PROTECTING PATTERNED DIELECTRIC-METAL COATINGS

CROSS-REFERENCE TO RELATED APPLICATION

The present application claims the benefit of previously filed Provisional Patent Application, Ser. No. 62/147,776, filed Apr. 15, 2015.

FIELD OF THE INVENTION

This invention belongs to the field of thin film dielectric-metal coatings. More specifically it is a method of using a dual coating and lift-off method for protecting patterned dielectric-metal coatings.

BACKGROUND OF THE INVENTION

Several prior art methods of depositing and protecting dielectric-metal coatings are known such as the method described in U.S. Pat. No. 7,648,808 issued to Buchsbaum et al., which deals with a final blanket coat deposited on top of patterned features. In the Buchsbaum disclosed method features are patterned and deposited using a lift-off process followed by a novel final blanket coating step that completes the coating stack and results in passivation of the metal layer edges. The passivation of the metal layer edges prevents oxidation and corrosion of the metal. The final blanket layer can be a group of layers such as a final cavity mirror, anti-reflection layers, or a single layer of a material. These layers may use materials specifically selected for their corrosion resistant properties. This prior art technique is compatible with partially or fully populated patterned areas but utilizes a continuous blanket coating over the coated and uncoated patterned regions. It is not compatible with wafers with bond pads or similar uncoated area requirements.

By using the 2-layer process disclosed in this application the prior art's limitations described above can now be overcome.

BRIEF SUMMARY OF THE INVENTION

The invention of this disclosure is a dual coating and lift-off method for protecting patterned dielectric-metal coatings using a 2-layer lithography process that is exposed and developed to create an undercut and then, after the wafer is coated with a metal/dielectric filter ending with an incomplete final layer, the top lithography layer is lifted off exposing the metal layer edges and leaving the bottom lithography layer intact on the wafer such that the final blanket layer(s) can be deposited to complete the coating and passivate the exposed metal layer edges.

BRIEF DESCRIPTION OF THE DRAWINGS

For a fuller understanding of the nature and objects of the invention, reference should be made to the following detailed description, taken in connection with the accompanying drawings, in which:

FIG. 1 is a diagram showing of the steps of the preferred embodiment of this disclosure.

DESCRIPTION OF THE PREFERRED EMBODIMENT

The preferred embodiment of this method starts with a 2-layer lift-off lithography process on a wafer (1) consisting of depositing lift-off resist (LOR) (2) and 1822 resist (3) (or other materials such as etch compatible metals or resists that can be determined by those skilled in the art after reading this disclosure), which is then exposed and developed to create a 1-4 micron undercut in the LOR (2). Next, the wafer (1) is coated with a 0.25-5 micron metal/dielectric thin film filter (4) that ends with an incomplete final coating layer. Next any metal/dielectric thin film filter (4) excess coating and 1822 resist (3) layer are selectively lifted off using acetone or equivalent, exposing the metal edges of the deposited metal/dielectric thin film filter (4) and leaving the LOR (2) pattern intact on the wafer (1). This leaves the patterned metal/dielectric thin film filter coating (4) with a 1-4 micron larger patterned perimeter, based on the size of the original LOR (2) under cut. Then a final blanket layer (5) is deposited to complete the deposited thin film filter coating (4) and passivate the metal layer edges. The final blanket layer deposition (5) can also consist of a multiple layer stack for some applications. Finally lift off the bottom layer (LOR) (2) and excess blanket layer deposition (5) leaving the patterned features on the wafer (1).

The steps of this 2-layer process are shown in FIG. 1 as follows:

First pattern a wafer (1) with a 2-layer process of bottom layer (LOR) (2) and top layer (1822 resist) (3), or other similar materials, which is then exposed and developed to create a 1-4 micron undercut in the LOR (2).

Next deposit the dielectric and metal filter layers (4) onto the patterned wafer (1) with an evaporation or sputtering process.

Then lift off the top layer (1822 resist) (3) and any excess dielectric and metal filter material (4) leaving the bottom layer (LOR) (2) intact on the wafer (1) and exposing the metal layer edges of the dielectric and metal filter layers (4).

Then deposit the final blanket coating(s) (5) in the enlarged bottom layer (LOR) (2) pattern to protect metal coating edges of the dielectric and metal filter layers (4) and complete the coating stack (4) and (5).

Then lift off the bottom layer (LOR) (2) and any excess final blanket coating(s) (5) leaving the patterned features.

Since certain changes may be made in the above described dual coating and lift-off method for protecting patterned dielectric-metal coatings without departing from the scope of the invention herein involved, thus it is intended that all matter contained in the description thereof or shown in the accompanying FIGURE shall be interpreted as illustrative of the claims and not in a limiting sense.

What is claimed is:

1. A dual coating and lift-off method for protecting patterned dielectric-metal coatings using a two-layer lithography process comprising:
    first patterning a wafer with a two-layer process of bottom layer lift-off resist and top layer resist;
    then exposing and developing said patterned wafer to create an undercut in said lift-off resist;
    next depositing dielectric and metal filter layers onto said patterned wafer using an evaporation or sputtering process;
    then lifting off said top layer resist and any excess deposited dielectric and metal filter material leaving said bottom layer lift-off resist intact on said wafer and exposing any metal layer edges of said deposited dielectric and metal filter in an enlarged bottom layer lift-off resist pattern;

then depositing one or more final blanket coatings only within said enlarged bottom layer lift off resist pattern to protect said metal layer edges and complete a coating stack;
and,
then lifting off said bottom layer lift-off resist and any excess final blanket coating leaving patterned features on said wafer.

\* \* \* \* \*